(12) United States Patent
Jung et al.

(10) Patent No.: US 9,035,684 B2
(45) Date of Patent: May 19, 2015

(54) DELAY LOCKED LOOP AND METHOD OF GENERATING CLOCK

(71) Applicant: Industry-Academic Cooperation Foundation, Yonsei University, Seoul (KR)

(72) Inventors: Seong-Ook Jung, Seoul (KR); Dong-Hoon Jung, Seoul (KR); Kyungho Ryu, Seoul (KR); Jung-Hyun Park, Seoul (KR)

(73) Assignee: Industry-Academic Cooperation Foundation, Yonsei University, Seoul (KR)

( * ) Notice: Subject to any disclaimer, the term of this patent is extended or adjusted under 35 U.S.C. 154(b) by 0 days.

(21) Appl. No.: 14/157,877

(22) Filed: Jan. 17, 2014

(65) Prior Publication Data

US 2014/0203854 A1   Jul. 24, 2014

(30) Foreign Application Priority Data

Jan. 18, 2013   (KR) .................. 10-2013-0006032

(51) Int. Cl.
  *H03L 7/06*   (2006.01)
  *H03L 7/08*   (2006.01)
(52) U.S. Cl.
  CPC .................. *H03L 7/0802* (2013.01)
(58) Field of Classification Search
  USPC ................................. 327/149, 158
  See application file for complete search history.

(56) References Cited

U.S. PATENT DOCUMENTS

| 7,046,060 | B1* | 5/2006 | Minzoni et al. | 327/158 |
|---|---|---|---|---|
| 7,263,152 | B2* | 8/2007 | Miller et al. | 375/371 |
| 7,298,189 | B2 | 11/2007 | Kang et al. | |
| 7,362,151 | B2* | 4/2008 | de la Torre | 327/156 |
| 7,397,880 | B2* | 7/2008 | Mitsumoto | 375/371 |
| 7,542,358 | B2 | 6/2009 | Jang | |
| 7,911,250 | B2 | 3/2011 | Okubo | |
| 7,994,832 | B2* | 8/2011 | Ali et al. | 327/158 |
| 8,049,543 | B2 | 11/2011 | Kang et al. | |
| 8,269,533 | B2* | 9/2012 | Maheshwari et al. | 327/158 |
| 8,791,734 | B1* | 7/2014 | Hara et al. | 327/156 |
| 2006/0044032 | A1* | 3/2006 | Gomm et al. | 327/157 |
| 2006/0087353 | A1* | 4/2006 | Minzoni et al. | 327/158 |
| 2006/0214710 | A1* | 9/2006 | Gomm et al. | 327/158 |
| 2011/0109356 | A1* | 5/2011 | Ali et al. | 327/158 |
| 2012/0105118 | A1* | 5/2012 | Yoon | 327/158 |
| 2013/0093483 | A1* | 4/2013 | Lamanna et al. | 327/157 |
| 2014/0002150 | A1* | 1/2014 | Seo et al. | 327/156 |
| 2014/0203854 | A1* | 7/2014 | Jung et al. | 327/158 |

FOREIGN PATENT DOCUMENTS

| KR | 1020040070616 A | 8/2004 |
|---|---|---|
| KR | 100769690 B1 | 10/2007 |
| KR | 1020080038517 A | 5/2008 |

* cited by examiner

*Primary Examiner* — Adam Houston
(74) *Attorney, Agent, or Firm* — Carter, DeLuca, Farrell & Schmidt, LLP

(57) ABSTRACT

Provided is a delay locked loop (DLL) including a ring oscillator (RO) including a delay line to delay a reference clock signal and generate a delayed clock signal, wherein the RO circulates, through the delay line, a feedback clock signal corresponding to the delayed clock signal to synchronize N cycles of the feedback clock signal with a cycle of the reference clock signal (where N is an integer number equal to or larger than 2); and a first frequency divider dividing the frequency of the delayed clock signal by 1/N (where N is an integer number equal to or larger than 2) to generate an output clock signal.

19 Claims, 10 Drawing Sheets

DELAY LOCKED LOOP AND METHOD OF GENERATING CLOCK

CROSS-REFERENCE TO RELATED APPLICATIONS

This U.S. non-provisional patent application claims priority under 35 U.S.C. §119 of Korean Patent Application No. 10-2013-0006032, filed on Jan. 18, 2013, the entire contents of which are hereby incorporated by reference.

BACKGROUND OF THE INVENTION

The present invention disclosed herein relates to a delay locked loop and method of generating a clock, and more particularly, to a delay locked loop that shifts the phase of a reference clock signal or corrects a duty cycle, and to a method of generating a clock phase-shifted from the reference clock signal or having a corrected duty cycle.

A delay locked loop (DLL) performs an operation of synchronizing the phase of an output clock with a reference clock. In general, the DLL may be used to generate an output clock phase-synchronized with the reference clock in an electronic device such as a semiconductor memory. A DLL circuit may be used for generating a timing signal for the operation of e.g., dynamic random access memory (DRAM), namely, a data sampling signal used when outputting data from a semiconductor memory device or when storing data in a semiconductor memory device.

The DLL which generates an output clock phase-shifted by 90° from an input clock for data sampling is used at the receiving unit of a memory interface. A phase shift DLL performs data sampling by using a clock 90° phase-shifted from the input clock. A main performance parameter of the phase shift DLL needed for obtaining a high data rate is phase shift accuracy and duty cycle correction.

A typical DLL performs 90° phase shift by using a plurality of delay lines. The typical DLL generates 90°, 180°, 270° and 360° phase-shifted clocks by using e.g., four delay lines. However, when controlling each delay line by using the same control code, it is difficult to obtain accurate phase shift due to a mismatch between delay lines and there is a limitation in that a phase shift error occurs.

It might also be considered to adjust a control code for each of the delay lines. In this case, the control codes of delay lines are independently determined so that each of the delay lines generates a delay corresponding to a ¼ cycle. However, since a controller must exist for each delay line independently, such a DLL has a limitation in that design complexity increases. Also, there are limitations in that a plurality of delay lines is needed and an area and power consumption increase.

On the other hand, when an output clock having an accurate duty cycle is used for data sampling, it is possible to decrease an error in data transmission and it is possible to increase a data rate. In the case of a semiconductor memory device, a signal timing margin may be maximized when the duty cycle of an output clock is maintained at 50%. When data is sampled by using an output clock of the duty cycle departs from 50%, a timing margin decreases and a bandwidth decreases, so it may be difficult to perform data sampling at an accurate timing.

However, due to factors such as a characteristic of an external jitter and non-uniform delay values of internal delay elements, the duty cycle of the output clock of a DLL frequently departs from 50%. As such, when there is a distortion of a duty cycle, there may be a setup/hold time violation in a flip-flop used as a register in a memory.

Thus, the DLL further employs an additional duty cycle correction (DCC) circuit to perform the correction of a duty cycle. In particular, in the case of a semiconductor memory sensitive to the duty cycle of a clock, such as a double data rate (DDR) memory that uses the falling edge of the clock as well as the rising edge thereof for data sampling, it is almost essential to incorporate the DCC circuit into the DLL.

A typical DCC circuit uses a plurality of delay lines to generate signals phase-delayed differently from a reference clock and uses signals having phase differences (such as signals having 90° and 270° phase differences with respect to the reference clock) to perform duty correction for obtaining a 50% duty cycle. However, due to a process variation, the delay time of each delay line may irregularly vary. Due to the mismatch between delay lines, the accuracy of duty cycle correction is not accurately ensured. Moreover, with the recent micro manufacturing process, the effect of a process variation increases and thus an error in duty cycle due to the mismatch between delay lines increases. In addition, since the typical DCC circuit is separately incorporated into the DLL in addition to delay lines to perform an operation of correcting a duty cycle, there are limitations in that the size of the DLL becomes large due to the DCC circuit and power consumption also increases.

SUMMARY OF THE INVENTION

The present invention provides a delay locked loop that has a compact size, achieves low power consumption and has an accurate phase shift function, and a method of generating a clock.

The present invention also provides a delay locked loop that has a compact size, achieves low power consumption and has an accurate duty cycle correction function, and a method of generating a clock.

The present invention also provides a delay locked loop that may accurately correct the duty cycle of a reference clock signal without a separate duty cycle correction block, and a method of generating a clock.

The present invention also provides a delay locked loop that may perform the phase shift function and the duty cycle correction function together, and a method of generating a clock.

The present invention also provides a delay locked loop that may generate an output clock signal having accurate phase and duty cycle irrespective of a process variation, and a method of generating a clock.

Challenges to be overcome by the present invention are not limited the above-mentioned challenges. Other technical challenges will be clearly understood by a person skilled in the art from the following description.

Embodiments of the present invention provide delay locked loops (DLL) including a ring oscillator (RO) including a delay line to delay a reference clock signal and generate a delayed clock signal, wherein the RO circulates, through the delay line, a feedback clock signal corresponding to the delayed clock signal to synchronize N cycles of the feedback clock signal with a cycle of the reference clock signal (where N is an integer number equal to or larger than 2); and a first frequency divider dividing the frequency of the delayed clock signal by 1/N (where N is an integer number equal to or larger than 2) to generate an output clock signal.

In some embodiments, the RO may include a signal selection unit selecting any one of the reference clock signal and the feedback clock signal as an input clock signal based on the feedback clock signal to input the selected signal to the delay line; and a delay control unit comparing N cycles of the feedback clock signal with a cycle of the reference clock signal to adjust a delay time of the delay line, wherein the delay line delays the input clock signal to generate the delayed clock signal.

In other embodiments, the RO may further include a dummy delay unit that delays the delayed clock signal by the delay time of the first frequency divider to generate the feedback clock signal.

In still other embodiments, after the feedback clock signal circulates, N times, through the RO, the signal selection unit may select the reference clock signal as the input clock signal and input the selected signal to the delay line, and in response to a rising edge of the reference clock signal, the signal selection unit may select the feedback clock signal as the input clock signal and input the selected signal to the delay line.

In even other embodiments, the delay control unit may include a phase detector comparing N cycles of the feedback clock signal with a cycle of the reference clock signal and generates any one of up, down and lock control signals; and a counter counting the control signal to generate a control code and inputting the control code to the delay line to adjust the delay time.

In yet other embodiments, the signal selection unit may include a selection signal generation unit generating a selection signal that has a rising edge or falling edge corresponding to the N circulations of the feedback clock signal and has a falling edge or rising edge corresponding to a rising edge of the reference clock signal; and a multiplexer selecting the reference clock signal as the input clock signal after the feedback clock signal circulates N times according to the selection signal, and selecting the feedback clock signal as the input clock signal in response to a rising edge of the reference clock signal.

In further embodiments, the selection signal generation unit may include a second frequency divider dividing the frequency of the feedback clock signal by 1/N (N is an integer number equal to or larger than 2) to generate a frequency division signal; and a selection logic generating the selection signal based on the frequency division signal and the reference clock signal.

In still further embodiments, the second frequency divider may generate the rising edge or falling edge corresponding to a falling edge of a Nth pulse of N cycles of the feedback clock signal, generate the falling edge or rising edge corresponding to the rising edge of the reference clock signal, to generate the selection signal.

In even further embodiments, the selection signal generation unit may include a counter a number of cycles that the feedback clock signal circulates through the RO; and a comparator comparing the number of cycles of the feedback clock signal with N (where N is an integer number equal to or larger than 2) to generate the selection signal.

In yet further embodiments, after the feedback clock signal circulates N times, the comparator may reset the counter to a default value.

In much further embodiments, the first frequency divider may generate a rising edge or falling edge corresponding to a first one of 2 N edges of N cycles of the delayed clock signal, generate a falling edge or rising edge corresponding to a N+1th one of the 2 N edges, to generate the output clock signal.

In still much further embodiments, the first frequency divider may generate the output clock signal 180°/N phase-shifted from the reference clock signal (N is an integer number equal to or larger than 2).

In even much further embodiments, the first frequency divider may generate the output clock signal having a 50% duty cycle.

In other embodiments of the present invention, methods of generating a clock include inputting a reference clock signal to a delay line to delay the signal to generate a delayed clock signal, and circulating a feedback clock signal corresponding to the delayed clock signal through the delay line to synchronize N cycles of the feedback clock signal (where N is an integer number equal to or larger than 2) with a cycle of the reference clock signal; and dividing a frequency of the delayed clock signal by 1/N (where N is an integer number equal to or larger than 2) to generate an output clock signal.

In some embodiments, the synchronizing of the N cycles of the feedback clock signal may include selecting any one of the reference clock signal and the feedback clock signal as an input clock signal based on the feedback clock signal; delaying the input clock signal at the delay line to generate a delayed clock signal; and comparing a cycle of the reference clock signal with N cycles of the feedback clock signal to adjust a delay time of the delay line according to a comparison result.

In other embodiments, the synchronizing of the N cycles of the feedback clock signal may further include delaying the delayed clock signal by a delay time of the output clock signal relative to the delayed clock signal to generate the feedback clock signal, after generating the delayed clock signal.

In still other embodiments, the selecting of the any one of the reference clock signal and the feedback clock signal as the input clock signal may include selecting the reference clock signal as the input clock signal and inputting the selected signal to the delay line, after the feedback clock signal circulates N times; and in response to a rising edge of the reference clock signal, selecting the feedback clock signal as the input clock signal and inputting the selected signal to the delay line.

In even other embodiments, the selecting of the any one of the reference clock signal and the feedback clock signal as the input clock signal may include generating a selection signal in response to N circulations of the feedback clock signal (where N is an integer number equal to or larger than 2) and a rising edge of the reference clock signal; and selecting any one of the feedback clock signal and the reference clock signal as the input clock signal according to the selection signal and inputting the selected signal to the delay line.

In yet other embodiments, the generating of the output clock signal may include generating a rising edge or falling edge in response to a first one of 2 N edges of N cycles of the delayed clock signal, generating a falling edge or rising edge in response to a N+1th one of the 2 N edges, to generate the output clock signal.

In further embodiments, the generating of the output clock signal may include generating the output clock signal 180°/N phase-shifted from the reference clock signal (where N is an integer number equal to or larger than 2).

In still further embodiments, the generating of the output clock signal may include generating the output clock signal of which the duty cycle is 50%.

BRIEF DESCRIPTION OF THE DRAWINGS

The accompanying drawings are included to provide a further understanding of the present invention, and are incorporated in and constitute a part of this specification. The drawings illustrate exemplary embodiments of the present invention and, together with the description, serve to explain principles of the present invention. In the drawings.

DETAILED DESCRIPTION OF PREFERRED EMBODIMENTS

Other advantages and features of the present invention, and implementation methods thereof will be clarified through following embodiments described with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Further, the present invention is only defined by scopes of claims. When some terms are not defined, all the terms used herein (including technology or science terms) have the same meanings as those generally accepted by typical technologies in the related art to which the present invention pertains. The terms defined in general dictionaries may be construed as having the same meanings as those used in the disclosure and/or the related art and even when some terms are not clearly defined, they should not be construed as being conceptual or excessively formal. When any component is referred to as being connected to another component, it should be understood that the former can be directly connected to the latter or indirectly connected to the latter via some other component. The general configuration of a delay locked loop (DLL) or a corresponding operation may not be provided in order not to obscure the subject matter of the present invention.

Figure 1:
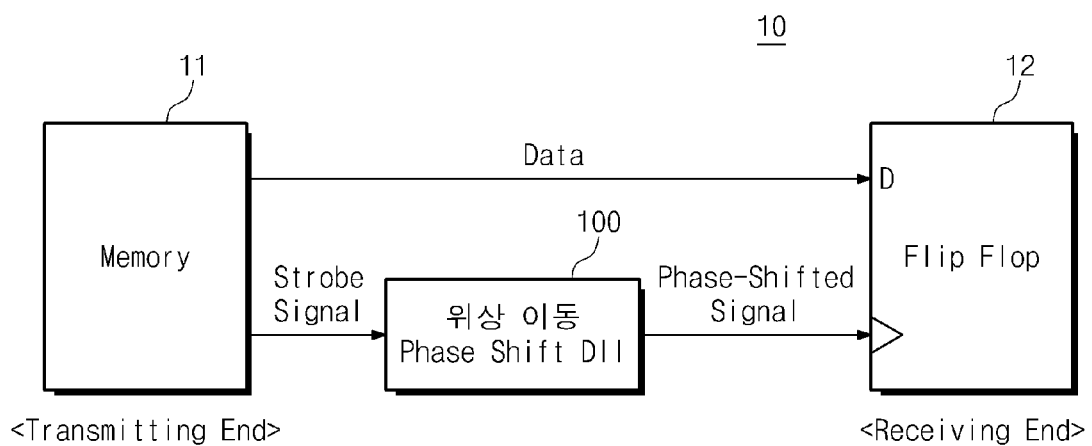
FIG. 1 is a schematic diagram of a memory interface including a delay locked loop (DLL) according to an embodiment of the present invention.

FIG. 1 is a schematic diagram of a memory interface including a DLL according to an embodiment of the present invention. As shown in FIG. 1, a memory interface 10 includes a memory on a transmitting end side transmitting data, a flip flop 12 on a receiving end side receiving data, and a DLL 100 that 90° phase shifts a strobe signal from the memory 11.

Figure 2:
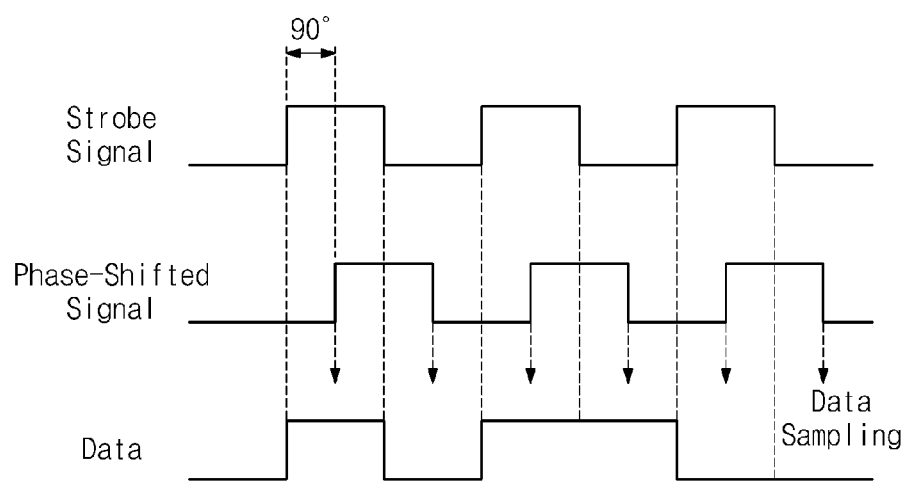
FIG. 2 is a timing diagram of signals showing how to sampling data by using a signal phase-shifted by the DLL in the embodiment shown in FIG. 1.

FIG. 2 is a timing diagram of signals showing how to sampling data by using a signal phase-shifted by the DLL in the embodiment shown in FIG. 1. Referring to FIGS. 1 and 2, the transmitting end of the memory interface 10 transmits a strobe signal synchronized with data transmission along with data to the DLL 100. The DLL 100 may be used to 90° shift the phase of the strobe signal at the receiving end of the memory interface 10 for data sampling.

Although FIG. 1 represents an example where the DLL 100 is applied to the memory interface 10, it is only an example, and the DLL according to an embodiment of the present invention may be used to phase shift a signal in various devices. Although FIG. 2 represents that the DLL 100 shifts the phase of a signal by 90°, the DLL 100 according to an embodiment of the present invention may shift the phase of a signal by other cycles. The DLL 100 according to an embodiment of the present invention may be used to accurately correct the duty cycle of a reference clock signal as well as to shift phase.

For example, the memory interface 10 as shown in FIG. 1 may obtain a high data rate as the accuracy of the phase shift of the DLL 100 rises and as the duty cycle of a phase-shifted signal is close to 50%. A typical phase shift DLL implements 90° phase shift by using e.g., four delay lines. When controlling each delay line on a typical phase shift DLL by using the same control code, it is difficult to obtain accurate phase shift due to the mismatch between delay lines. If otherwise controlling each delay line by using different control codes, design complexity increases since a controller for each delay line needs to independently exist. In addition, a separate duty cycle correction (DCC) block is typically incorporated into a phase shift DLL to correct the duty cycle of a clock.

As such, there are limitations in that the error of the typical phase shift DLL is great, and due to a plurality of delay lines and a DCC block, a size increases and power consumption is high. In the following, an embodiment of the present invention describes a DLL that may generate an accurately phase-shifted clock signal without increasing the size of a delay line and power consumption, and generate a clock signal of which the duty cycle is accurately corrected to be 50%, without incorporating a separate DCC block. A DLL according to an embodiment of the present invention may implement accurate phase shift and DCC functions irrespective of a process variation.

Figure 3:
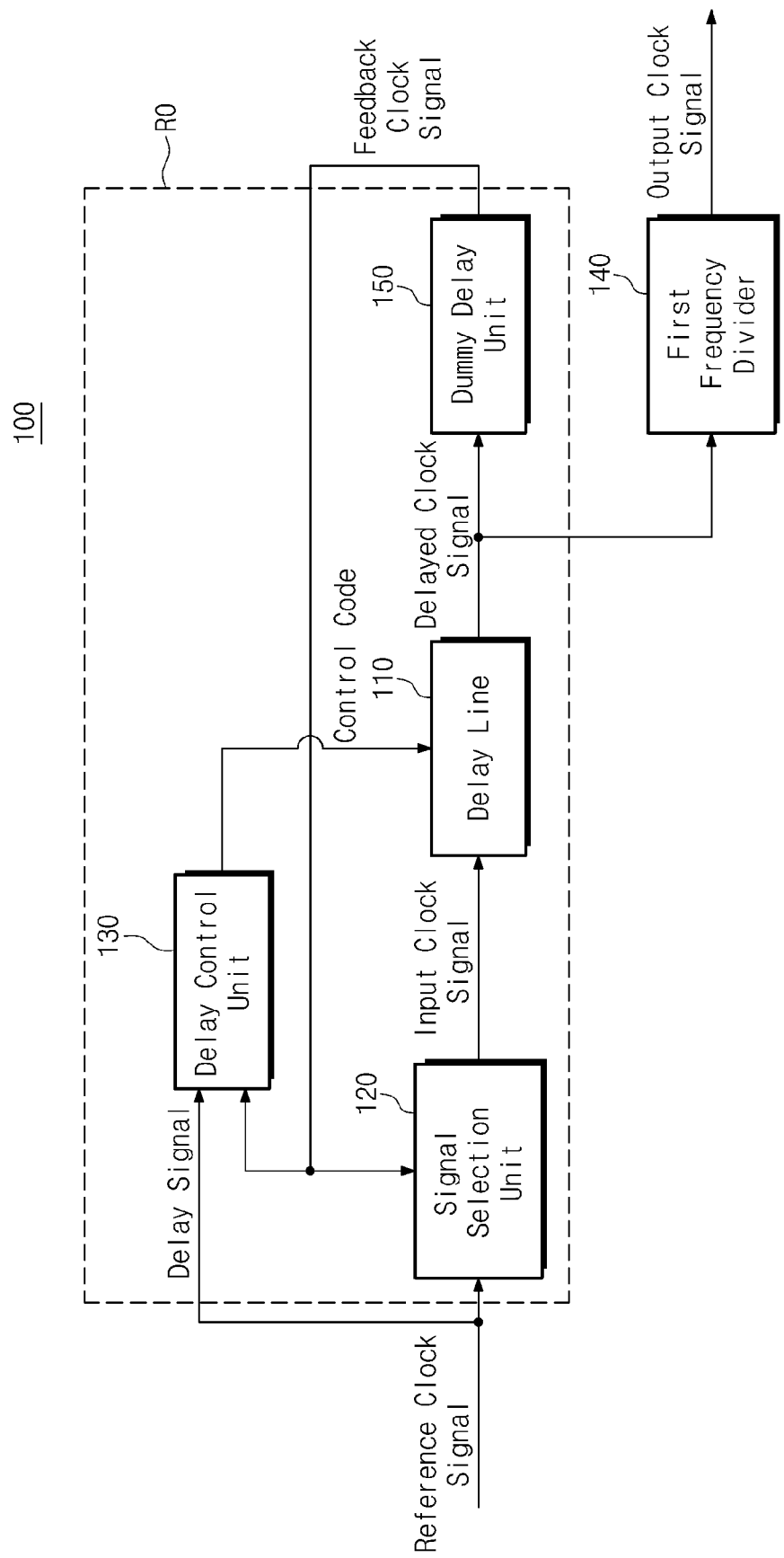
FIG. 3 is a schematic diagram of a DLL according to an embodiment of the present invention.

FIG. 3 is a schematic diagram of a DLL according to an embodiment of the present invention. As shown in FIG. 3, the DLL 100 according to an embodiment of the present invention includes a ring oscillator (RO) and a first frequency divider 140. The RO includes a delay line 110, a signal selection unit 120, a delay control unit 130, and a dummy delay unit 150. The delay line 110 receives an input clock signal selected from a reference clock signal and a feedback clock signals from the signal selecting unit 120 and delays the input clock signal to generate a delayed clock signal. The delay time of the delay line 110 is adjusted according to a control code from the delay control unit 130.

The dummy delay unit 150 is connected to the output of the delay line 110 and delays the delayed clock signal to generate feedback clock signals. According to an embodiment, the dummy delay unit 150 may delay the delayed clock signal by the delay time of the first frequency divider 140 to generate feedback clocks signals. That is, the dummy delay unit 150 is incorporated into the RO to compensate for the delay time of the first frequency divider 140. The dummy delay unit 150 may be designed to have the same delay time as the first frequency divider 140. A feedback clock signal corresponds to the delayed clock signal and is delayed by the delay time of the dummy delay unit 150 from the delayed clock signal.

When the delay time of the first frequency divider 140 is too short and may thus be ignored, the dummy delay unit 150 may not be provided. As another example, also when a separate circuit (not shown) to synchronize an output clock signal with the feedback clock signal, the dummy delay unit may not be provided. Unlike FIG. 3, according to an embodiment of the present invention where the dummy delay unit 150 is not provided, the feedback clock signal means the same signal as the delayed clock signal.

The delay control unit 130 receives the feedback clock signal from the output of the dummy delay unit 150, generates a control code to control the delay line 110, by comparing a cycle (period) of the reference clock signal with N cycles of the feed back clock (N is an integer number equal to or larger than 2), namely, the cycle (of the feedback clock signal)×N. Thus, the delay time of the delay line 110 is adjusted. As such, the RO circulates the feedback clock signal through the delay line 110 and synchronizes the N cycles of the feedback clock signal with a cycle of the reference clock signal.

Since the feedback clock signal is generated in the RO by circulating, N times, through the same delay line 110 and the dummy delay unit 150, each cycle of the feedback clock signal has the same pulse width and period. Since the delayed clock signal is generated in the RO by also circulating, N times, through the same delay line 110 and the dummy delay unit 150, each cycle of the delayed clock signal has the same pulse width and period. When the N cycles of the feedback clock signal are synchronized with a cycle of the reference clock, the delayed clock signal and the feedback clock signal have N times the frequency of the reference clock signal.

The first frequency divider 140 is connected to the output of the delay line 110 and divides the frequency of the delayed clock signal by 1/N (N is an integer number equal to or larger than 2) to generate the output clock signal. Thus, an output cock signal having the same frequency as the reference clock signal is generated. The first frequency divider 140 may frequency-divide the delayed clock signal so that an output clock signal phase-shifted by 180°/N from the reference clock signal is generated.

In order to alternately perform the circulation of the feedback clock signal and the synchronization of the N cycles of the feedback clock signal with a cycle of the reference clock signal, the signal selection unit 120 selectively inputs the reference clock signal or the feedback clock signal to the delay line 110. In this case, the signal selection unit 120 receives the feedback clock signal from the output of the dummy delay unit 150, selects any one of the feedback clock signal and the reference clock signal as an input clock signal based on the feedback clock signal, and inputs the selected signal to the delay line 110.

The signal selection unit 120 may select any one of the reference clock signal and the feedback clock as an input clock signal, according to the number of cycles which the feedback clock signal circulates through the RO, and the rising edge of the reference clock signal. That is, after the feedback clock signal circulates, N times, through the RO, the signal selection unit 120 may select the reference clock signal as an input signal and input the selected signal to the delay line 110, and in response to the rising edge of the reference clock signal, the signal the signal selection unit 120 may select the feedback clock signal as an input signal and input the selected signal to the delay line 110.

Figure 4:
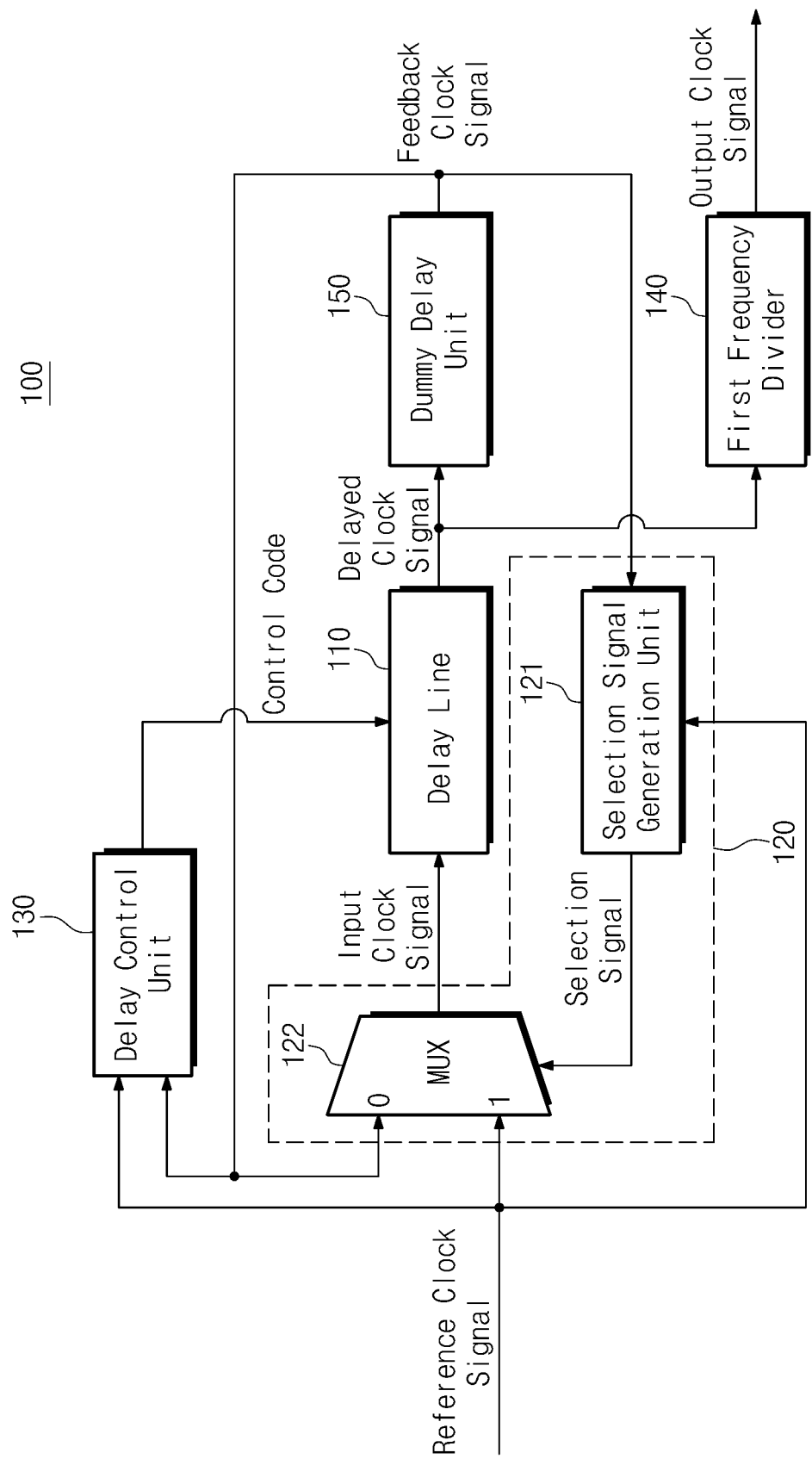
FIG. 4 is a more detailed diagram of the DLL shown in FIG. 3.

FIG. 4 is a more detailed diagram of the DLL shown in FIG. 3. When describing the components shown in FIG. 4, the same components as those described in FIG. 3 are not described. As shown in FIG. 4, the selection unit 120 includes a selection signal generation unit 121 and a multiplexer 122.

The selection signal generation unit 121 may generate a selection signal based on the number of times (number of cycles) that the feedback clock signal circulates through the RO. The selection signal generation unit 121 may generate a rising edge of the selection signal in response to the N circulations of the feedback clock signal and generate a falling edge of the selection signal in response to the rising edge of the reference clock signal, to generate the selection signal. The selection signal generation unit 121 may also generate the falling edge of the selection signal in response to the N circulations of the feedback clock signal and generate the rising edge of the selection signal in response to the rising edge of the reference clock signal.

The multiplexer 122 is timing-controlled by the selection signal having a frequency corresponding to the 1/N of the feedback clock signal. The multiplexer 122 selects any one of the feedback clock signal and the reference clock signal as an input clock signal according to the selection signal and inputs the selected signal to the delay line 110. That is, the multiplexer 122 selects the reference clock signal as the input clock signal whenever the feedback clock signal circulates, N times, through the RO and selects the feedback clock signal as the input clock signal in response to the rising edge of the reference clock signal.

Figure 5:
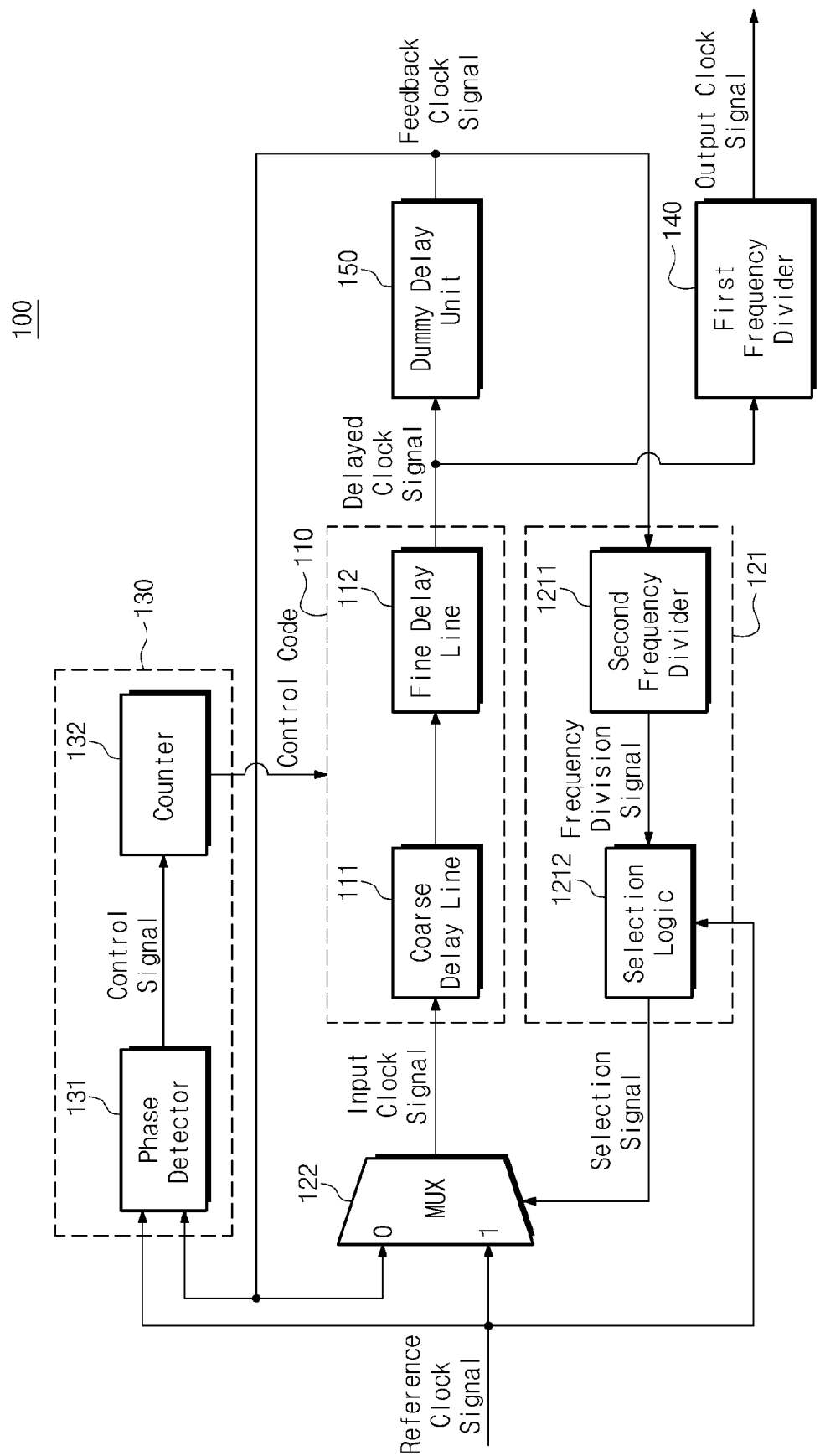
FIG. 5 is a more detailed diagram of the DLL shown in FIG. 4 according to an embodiment of the present invention.

FIG. 5 is a more detailed diagram of the DLL shown in FIG. 4. When describing the components shown in FIG. 5, components described in FIG. 4 are not described. As shown in FIG. 5, the selection signal generation unit 121 includes a second frequency divider 1211 and a selection logic 1212.

The second frequency divider 1211 divides the frequency of the feedback clock signal by 1/N and generates a frequency division signal. When two cycles of the feedback clock signal are synchronized with a cycle of the reference clock signal, the second frequency divider 1211 generates a falling edge of the frequency division signal in response to a falling edge of a first pulse of the two cycles of the feedback clock signal and generates a rising edge of the frequency division signal in response to a falling edge of a second pulse thereof, to generate the frequency division signal. The second frequency divider 1211 may also generate the rising edge of the frequency division signal in response to the falling edge of the first pulse of two cycles of the feedback clock signal and generate the falling edge of the frequency division signal in response to the falling edge of the second pulse thereof. The second frequency divider 1211 may be implemented in e.g., a T-flip flop. The frequency division signal will have the same frequency as the reference clock signal.

The selection logic 1212 generates a selection signal based on the frequency division signal from the second frequency divider 1211 and the reference clock signal. As an example, the selection logic 1212 may generate a rising edge of the selection signal in response to a rising edge of the frequency division signal and generates a falling edge of the selection signal in response to a rising edge of the reference clock signal, to generate the selection signal. The selection logic 1212 may also generate the falling edge of the selection signal in response to the rising edge of the frequency division signal and generate the rising edge of the selection signal in response to the rising edge of the reference clock signal.

The delay control unit 130 may generate a control code by comparing a cycle of the reference clock signal with N cycles of the feedback clock, e.g., every rising edge of the reference clock signal. According to an embodiment, the delay control unit 130 includes a phase detector 131 and a counter 132.

The phase detector 131 compares N cycles of the feedback clock signal with a cycle of the reference clock signal and generates any one of 'up', 'down' and 'lock' control signals. The counter 132 counts a control signal from the phase detector 131 to generate a control code and inputs the control code to the delay line 110 to adjust a delay time.

When N cycles of the feedback clock signal are larger than a cycle of the reference clock signal, the delay control unit 130 will generate a control code to decrease the delay time of the delay line 110, and when the case is the opposite, the delay control unit 130 will generate a control code to increase the delay time of the delay line 110.

The delay line 110 may include e.g., a coarse delay line (CDL) 111 and a fine delay line (FDL) 112. The FDL 112 will be designed to cover the delay step of the CDL 111. The delay control unit 130 may individually input a control code to the CDL 111 and the FDL 112 and adjust the delay time of the delay line 110.

The DLL according to an embodiment of the present invention repetitively performs the processes of alternately inputting the reference clock signal and the feedback clock signal to the delay line 110 by using the signal selection unit 120, comparing N cycles of the feedback clock signal circulating through the RO with the phase of the reference clock signal every cycle of the reference clock signal, and adjusting the delay time of the delay line 110 according to a comparison result. Thus, when N cycles of the feedback clock signal are synchronized with the reference clock signal, a feedback clock signal having N times the frequency of the reference clock signal and synchronized with the reference clock signal will be generated.

The first frequency divider 140 frequency-divides the delayed clock signal having the same frequency as the synchronized feedback clock signal to generate an output clock signal. The first frequency divider 140 will divide a frequency of the delayed clock signal by 1/N to generate an output clock signal having the same frequency as the reference clock signal. For example, when two cycles of the feedback clock signal are synchronized with a cycle of the reference clock signal, the first frequency divider 140 may form a rising edge in response to the rising edge of a clock corresponding to a first one of two cycles of the delayed clock signal and form a falling edge in response to the rising edge of a clock corresponding to a second cycle thereof to generate an output clock signal phase-shifted by 90° from the reference clock signal. If the first frequency divider 140 forms the falling edge of an output clock signal in response to the rising edge of a clock corresponding to a first one of two cycles of the delayed clock signal and form the rising edge of an output clock signal in response to the rising edge of a clock corresponding to a second cycle thereof, an output clock signal phase-shifted by 270° from the reference clock signal may be generated.

Figure 6:
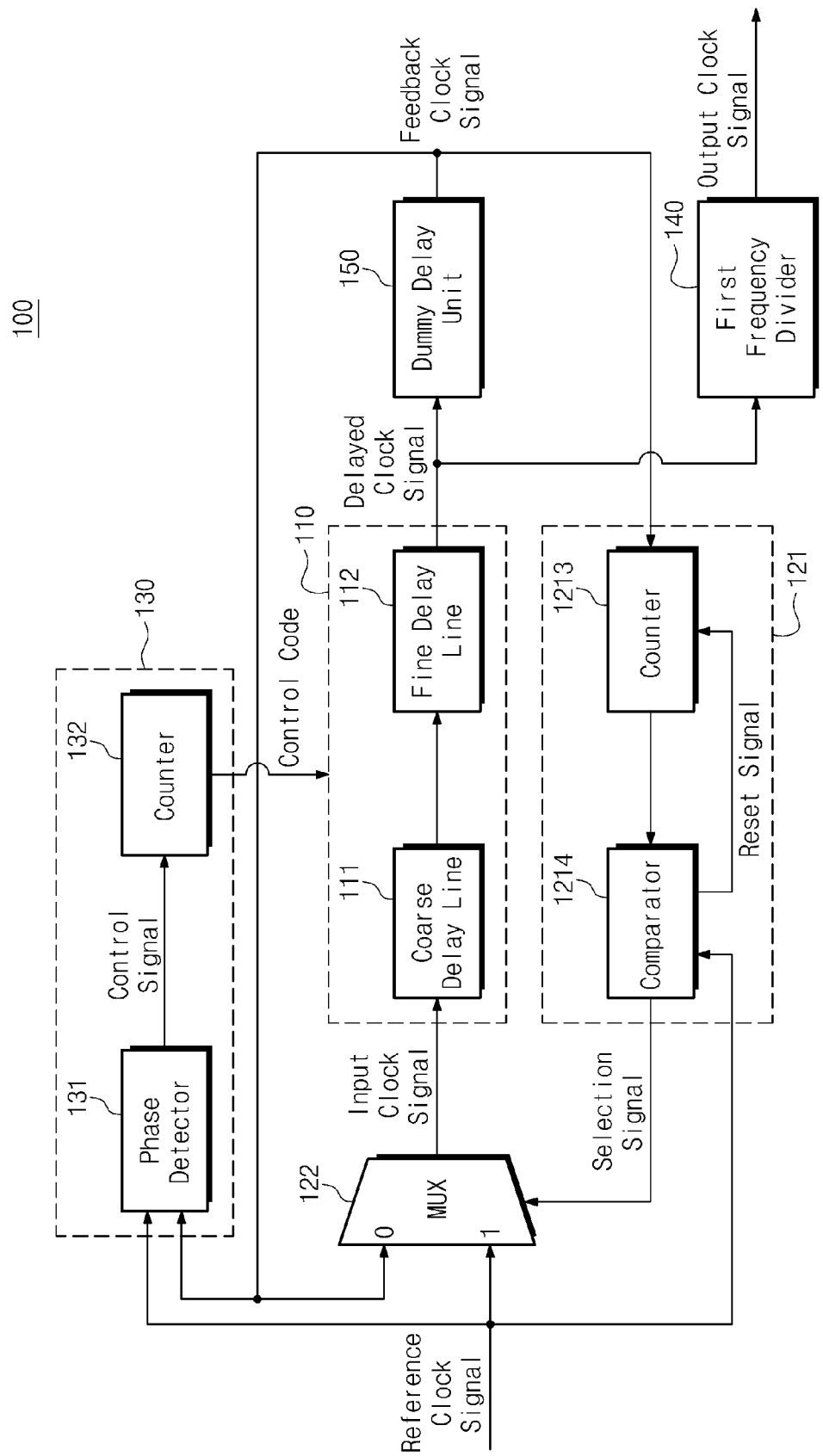
FIG. 6 is another diagram of the DLL shown in FIG. 4 according to another embodiment of the present invention.

FIG. 6 is another diagram of the DLL shown in FIG. 4 according to another embodiment of the present invention. Referring to FIG. 6, the selection signal generation unit 121 includes a counter 1213 and a comparator 1214. The counter 1213 counts the number of cycles that the feedback clock signal circulates through the RO. The comparator 1214 receives the number of cycles of the feedback clock signal from the counter 1213 and compares the number of cycles of the feedback clock signal with a comparison value N to generate a selection signal. The comparator 1214 may generate the rising edge of the selection signal when the feedback clock signal circulates, N times, through the RO, and the comparator 1214 may generate the falling edge of the selection signal in response to the rising edge of the reference clock signal. When the feedback clock signal circulates, N times, through the RO, the comparator 1214 inputs a reset signal to the counter 1213. Thus, the counter 1213 is reset to a default value, namely, '0'. When a new cycle of the feedback clock signal is input, the counter 1213 will again count the number of the cycles of the feedback clock signal from then.

According to an embodiment, the first frequency divider 140 may generate a rising edge in response to a first one of 2 N edges (N rising edges and N falling edges) of N cycles of the delayed clock signal corresponding to an cycle of the reference clock signal and generate a falling edge in response to an N+1th one of the 2 N edges, to generate an output clock signal phase-shifted by 180° from the reference clock signal.

In an embodiment of the present invention, since each cycle of the feedback clock signal and the delayed clock signal is generated by a circulation through the same delay line 110 and the dummy delay unit 150, it has the same pulse width and period. For example, when two cycles of the feedback clock signal are synchronized with a cycle of the reference clock signal, the phase difference between the falling edges (or rising edges) of two clocks of two cycles of the feedback clock signal is represented to be accurately 180°. Thus, according to an embodiment of the present invention, it is possible to generate an output clock signal having an accurately 50% duty cycle. In an embodiment of the present invention, a duty cycle means a ratio of the pulse width of a clock to a cycle of a clock.

Since the DLL 100 according to an embodiment of the present invention does not use a plurality of delay lines, but use only one delay line 110 to circulate, N times, the feedback clock signal through the RO to implement phase shift and duty cycle correction, it is possible to accurately phase shift and duty cycle correction together irrespective of a mismatch and a process variation due to different characteristics of delay lines. Thus, it is possible to decrease the size of the delay line 110 and correct a duty cycle without a separate duty cycle correction block, so it is possible to reduce the size of the DLL 100 and power consumption.

Figure 7:
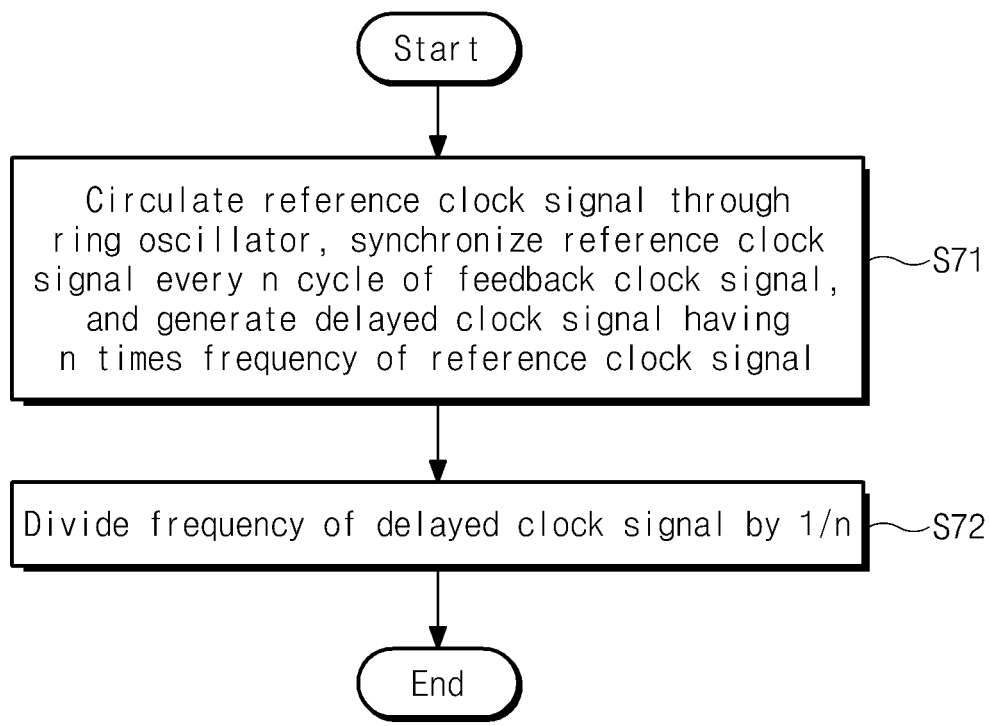
FIG. 7 is a flowchart of a method of generating a clock according to an embodiment of the present invention.

FIG. 7 is a flowchart of a method of generating a clock according to an embodiment of the present invention. Referring to FIGS. 3 to 7, in step S71, the RO firstly inputs and delays a reference clock signal to the delay line 110 to generate a delayed clock signal, circulates a feedback clock signal through the delay line 110, and synchronizes N cycles of the feedback clock signal with a cycle of the reference clock signal. Thus, a delayed clock signal having N times the frequency of the reference clock signal is generated. In step S72, the first frequency divider 140 divides the frequency of the delayed clock signal by 1/N to generate an output clock signal which is phase-shifted from the reference clock signal and of which the duty cycle is corrected.

Figure 8:
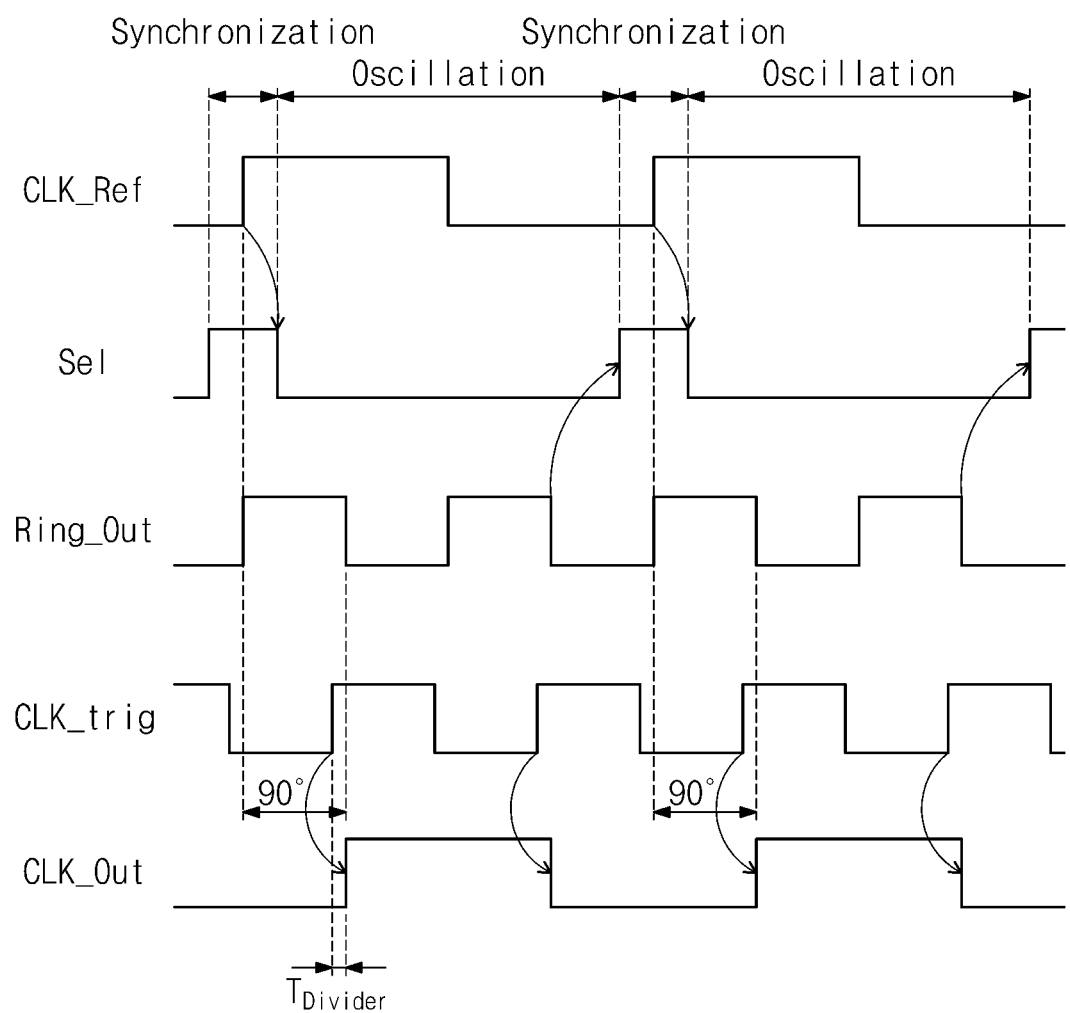
FIGS. 8 to 11 are timing diagrams of signals for explaining the operation of a DLL according to an embodiment of the present invention.

FIGS. 8 to 11 are timing diagrams of signals for explaining the operation of a DLL according to an embodiment of the present invention. Referring to FIGS. 3 to 8, in step S71, N cycles of a feedback clock signal Ring_Out are synchronized with a cycle of a reference clock signal CLK_Ref. A case where two cycles of the feedback clock signal are synchronized with a cycle of the reference clock signal CLK_Ref as shown in FIG. 8 is described as an example.

When a selection signal Sel is in a high level, the signal selection unit 120 inputs the reference clock signal CLK_Ref to the delay line 110. The reference clock signal CLK_Ref is delayed by the delay line 110 and inversed by the dummy delay unit 150, so the feedback clock signal Ring_Out is generated.

In response to the rising edge of the reference clock CLK_Ref, the selection signal generation unit 121 of the signal selection unit 120 generates the falling edge of the selection signal Sel. Thus, a low-level selection signal Sel is input to the multiplexer 122, and the multiplexer 122 selects the feedback clock signal Ring_Out as an input clock signal and inputs the selected signal to the delay line 110. Thus, the feedback clock signal Ring_Out circulates through the RO.

The selection signal generation unit 121 senses the number of cycles that the feedback clock signal Ring_Out circulates through the RO. In response to two circulations of the feedback clock signal Ring_Out, the rising edge of the selection signal Sel is generated. As an example, the selection signal generation unit 121 may use a T-flip flop to generate a frequency division signal that has a falling edge corresponding to a first falling edge of the feedback clock signal Ring_Out and a rising edge corresponding to a second falling edge of the feedback clock signal Ring_Out, to divide a frequency of the feedback clock signal Ring_Out by ½ times. The selection signal generation unit 121 may generate the rising edge of the selection signal Sel in response to the rising edge of the frequency division signal. As another example, the selection signal generation unit 121 may also determine whether two circulations of the feedback clock signal Ring_Out are performed by counting the pulses of the feedback clock signal Ring_Out.

Whenever the reference clock signal CLK_Ref is input, the delay control unit 130 compares a cycle of the reference clock signal CLK_Ref with the phase of two cycles of the feedback clock signal Ring_Out to generate a control code, so the delay time of the delay line 110 is controlled. If an operation of circulating the feedback clock signal Ring_Out through the RO and an operation of synchronizing the cycles of the feedback clock signal with a cycle of the reference clock signal CLK_Ref are repetitively performed, two cycles of the feedback clock signal Ring_Out are synchronized with a cycle of the reference clock signal CLK_Ref.

In step S72, the first frequency divider 140 divides the frequency of a delayed clock signal CLK_trig by ½ times to generate an output clock signal CLK_Out. The feedback clock signal Ring_Out is generated by circulating, four times, through the RO. A first falling edge of the feedback clock signal Ring_Out has a 90° phase difference from the reference clock signal CLK_Ref and a second falling edge thereof has a 270° phase difference from the reference clock signal CLK_Ref.

The first frequency divider 140 uses the first falling edge and the second falling edge of the delayed clock signal CLK_trig to generate an output clock signal CLK_Out phase shifted by 90° from the reference clock signal CLK_Ref. The feedback clock signal Ring_Out is delayed by the delay time $T_{Divider}$ of the first frequency divider 140 from the delayed clock signal CLK_trig by the dummy delay unit 150. Thus, the output clock signal CLK_Out is synchronized with the reference clock signal CLK_Ref.

The high pulse width (HPW) of the output clock signal CLK_Out is the same as the low pulse width (LPW) of the output clock signal CLK_Out. The reason is because both the HPW and the LPW are generated while the feedback clock signal Ring_Out circulates, two times, through the same RO. This means that the duty cycle of the output clock signal CLK_Out is 50%.

Figure 9:
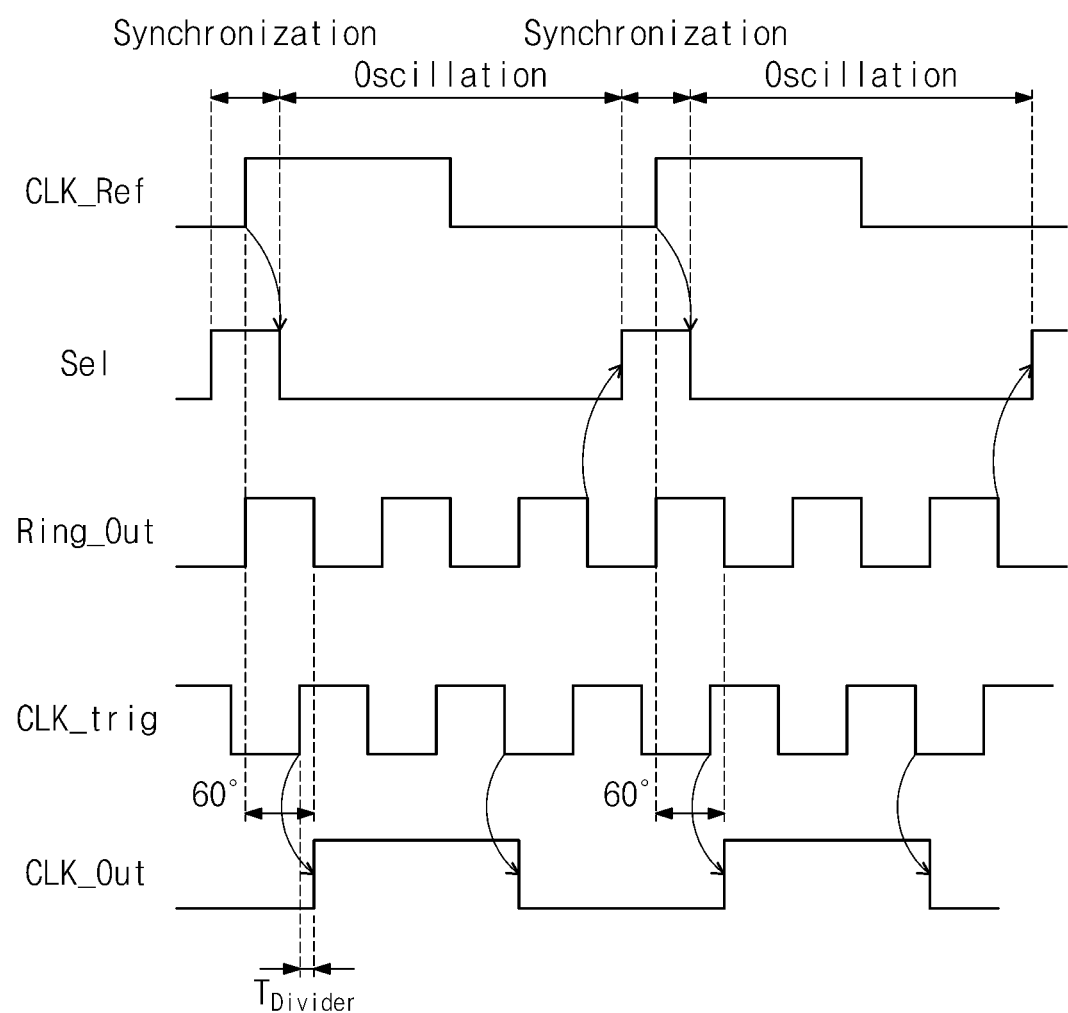

FIG. 9 is a timing diagram of signals for explaining the operation of a DLL according to an embodiment of the present invention. As shown in FIG. 9, if three cycles of the feedback clock signal Ring_Out is synchronized with a cycle of the reference clock signal CLK_Ref, an output clock signal CLK_Out phase-shifted by 60° from the reference clock signal CLK_Ref may be generated. In this case, since both the HPW and LPW of the output clock signal CLK_Out are generated while the feedback clock signal RING_Out circulates, three times, through the same RO, the output clock signal CLK_Out has a 50% duty cycle irrespective of a process variation.

Figure 10:
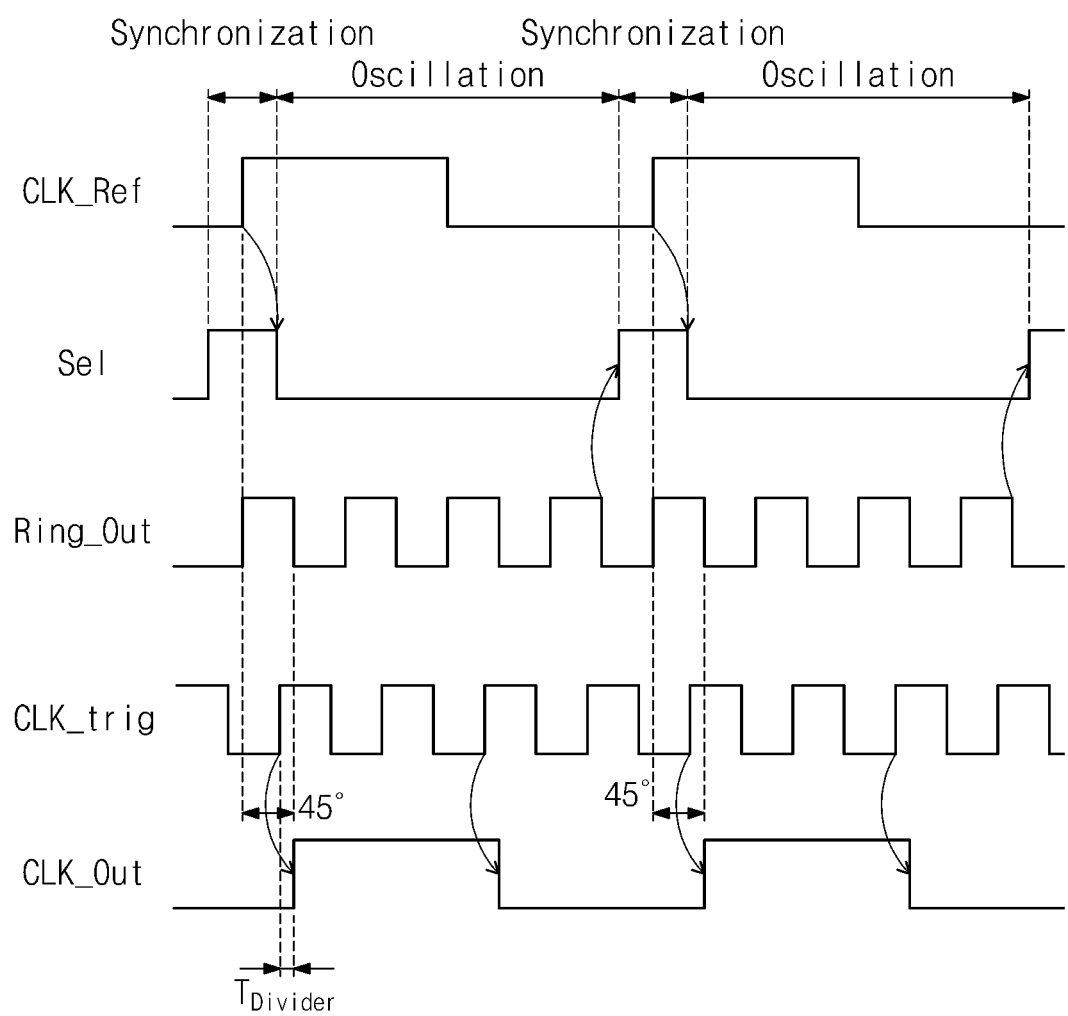

FIG. 10 is a timing diagram of signals for explaining the operation of a DLL according to an embodiment of the present invention. As shown in FIG. 10, if four cycles of the feedback clock signal Ring_Out is synchronized with a cycle of the reference clock signal CLK_Ref, an output clock signal CLK_Out phase-shifted by 45° from the reference clock signal CLK_Ref may be generated. In an embodiment shown in FIG. 10, the first frequency divider 140 may connect e.g., two T-flip flops to generate a pulse of an output clock signal CLK_Out from four pulses of the delayed clock signal CLK_trig.

Figure 11:
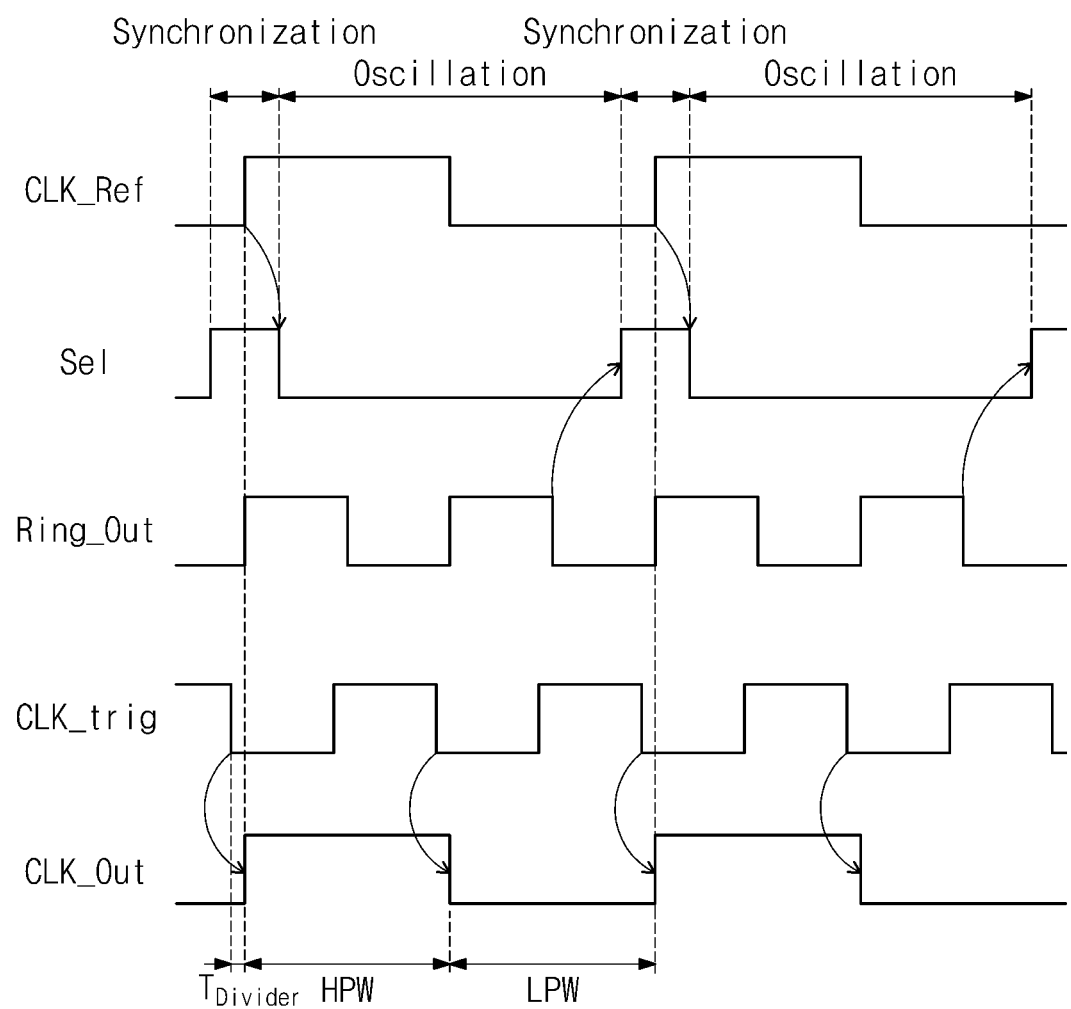

FIG. 11 is a timing diagram of signals for explaining the operation of a DLL according to another embodiment of the present invention. As shown in FIG. 11, if two cycles of the feedback clock signal Ring_Out is synchronized with a cycle of the reference clock signal CLK_Ref, an output clock signal is generated to have a falling edge corresponding to the falling edge of a first clock of the delayed clock signal CLK_trig and have a rising edge corresponding to the falling edge of a second clock of the delayed clock signal CLK_trig, to generate an output clock signal that is synchronized with the reference clock signal CLK_Ref and has a 50% duty cycle. According to an embodiment shown in FIG. 11, a DLL correcting a duty cycle is provided.

According to an embodiment of the present invention, since a high level section and low level section of a feedback clock signal are generated by circulating through the same RO, they have the same pulse width. Thus, a trouble with a typical DLL that a phase error occurs due to the mismatch between delay lines is overcome and it is possible to implement accurate phase shift. According to an embodiment of the present invention, since the delay time of the delay line 110 is controlled so that N cycles of the feedback clock signal is synchronized every period of a reference clock signal, it is possible to decrease jitter noise. According to an embodiment of the present invention, it is possible to generate an output clock signal having an accurately 50% duty cycle without a additional duty cycle correction block. According to an embodiment of the present invention, the length of a delay line becomes ¼ times the length of a typical DLL implementing 90° phase shift. Thus, it is possible to decrease the size of the DLL and power consumption.

Since the above embodiments are presented to help the understanding of the present invention, it should be understood that they do not limit the scope of the present invention and various variations thereto also belong to the scope of the present invention. The technical protective scope of the present invention should be defined by the technical spirit of the following claims and it should be understood that the technical protective scope of the present invention is not limited to the wording of the claims but actually reaches inventions having equivalent technical values.

What is claimed is:

1. A delay locked loop (DLL) comprising:
   a ring oscillator (RO) including a delay line to delay a reference clock signal and generate a delayed clock signal, wherein the RO circulates, through the delay line, a feedback clock signal corresponding to the delayed clock signal to synchronize N cycles of the feedback clock signal with a cycle of the reference clock signal (where N is an integer number equal to or larger than 2); and
   a first frequency divider dividing the frequency of the delayed clock signal by 1/N (where N is an integer number equal to or larger than 2) to generate an output clock signal,
   wherein the RO selects at least one of the reference clock signal and the feedback clock signal as an input clock signal based on the feedback clock signal to input the selected signal to the delay line;
   wherein after the feedback clock signal circulates, N times, through the RO, the RO selects the reference clock signal as the input clock signal and inputs the selected reference clock signal to the delay line; and wherein in response to a rising edge of the reference clock signal, the RO selects the feedback clock signal as the input clock signal and inputs the selected feedback clock signal to the delay line.

2. The delay locked loop (DLL) of claim 1, wherein the RO comprises:
a signal selection unit selecting the at least one of the reference clock signal and the feedback clock signal as the input clock signal based on the feedback clock signal to input the selected signal to the delay line; and
a delay control unit comparing N cycles of the feedback clock signal with a cycle of the reference clock signal to adjust a delay time of the delay line, wherein the delay line delays the input clock signal to generate the delayed clock signal.

3. The delay locked loop (DLL) of claim 2, wherein the RO further comprises a dummy delay unit that delays the delayed clock signal by the delay time of the first frequency divider to generate the feedback clock signal.

4. The delay locked loop (DLL) of claim 2, wherein after the feedback clock signal circulates, N times, through the RO, the signal selection unit selects the reference clock signal as the input clock signal and inputs the selected signal to the delay line, and in response to the rising edge of the reference clock signal, the signal selection unit selects the feedback clock signal as the input clock signal and inputs the selected signal to the delay line.

5. A delay locked loop (DLL) comprising:
a ring oscillator (RO) including a delay line to delay a reference clock signal and generate a delayed clock signal, wherein the RO circulates, through the delay line, a feedback clock signal corresponding to the delayed clock signal to synchronize N cycles of the feedback clock signal with a cycle of the reference clock signal (where N is an integer number equal to or larger than 2); and
a first frequency divider dividing the frequency of the delayed clock signal by 1/N (where N is an integer number equal to or larger than 2) to generate an output clock signal,
wherein the RO comprises:
a signal selection unit selecting at least one of the reference clock signal and the feedback clock signal as an input clock signal based on the feedback clock signal to input the selected signal to the delay line; and
a delay control unit comparing N cycles of the feedback clock signal with a cycle of the reference clock signal to adjust a delay time of the delay line, wherein the delay line delays the input clock signal to generate the delayed clock signal, wherein the delay control unit comprises:
a phase detector comparing N cycles of the feedback clock signal with a cycle of the reference clock signal and generates any one of up, down and lock control signals; and
a counter counting the control signal to generate a control code and inputting the control code to the delay line to adjust the delay time.

6. A delay locked loop (DLL) comprising:
a ring oscillator (RO) including a delay line to delay a reference clock signal and generate a delayed clock signal, wherein the RO circulates, through the delay line, a feedback clock signal corresponding to the delayed clock signal to synchronize N cycles of the feedback clock signal with a cycle of the reference clock signal (where N is an integer number equal to or larger than 2); and
a first frequency divider dividing the frequency of the delayed clock signal by 1/N (where N is an integer number equal to or larger than 2) to generate an output clock signal,
wherein the RO comprises:
a signal selection unit selecting at least one of the reference clock signal and the feedback clock signal as an input clock signal based on the feedback clock signal to input the selected signal to the delay line; and
a delay control unit comparing N cycles of the feedback clock signal with a cycle of the reference clock signal to adjust a delay time of the delay line, wherein the delay line delays the input clock signal to generate the delayed clock signal, wherein the signal selection unit comprises:
a selection signal generation unit generating a selection signal that has a rising edge or falling edge corresponding to the N circulations of the feedback clock signal and has a falling edge or rising edge corresponding to a rising edge of the reference clock signal; and
a multiplexer selecting the reference clock signal as the input clock signal after the feedback clock signal circulates N times according to the selection signal, and selecting the feedback clock signal as the input clock signal in response to a rising edge of the reference clock signal.

7. The delay locked loop (DLL) of claim 6, wherein the selection signal generation unit comprises:
a second frequency divider dividing the frequency of the feedback clock signal by 1/N (N is an integer number equal to or larger than 2) to generate a frequency division signal; and
a selection logic generating the selection signal based on the frequency division signal and the reference clock signal.

8. The delay locked loop (DLL) of claim 7, wherein the second frequency divider generates the rising edge or falling edge corresponding to a falling edge of a Nth pulse of N cycles of the feedback clock signal, generates the falling edge or rising edge corresponding to the rising edge of the reference clock signal, to generate the selection signal.

9. The delay locked loop (DLL) of claim 6, wherein the selection signal generation unit comprises:
a counter a number of cycles that the feedback clock signal circulates through the RO; and
a comparator comparing the number of cycles of the feedback clock signal with N (where N is an integer number equal to or larger than 2) to generate the selection signal.

10. The delay locked loop (DLL) of claim 9, wherein after the feedback clock signal circulates N times, the comparator resets the counter to a default value.

11. A delay locked loop (DLL) of claim 1, comprising:
a ring oscillator (RO) including a delay line to delay a reference clock signal and generate a delayed clock signal, wherein the RO circulates, through the delay line, a feedback clock signal corresponding to the delayed clock signal to synchronize N cycles of the feedback clock signal with a cycle of the reference clock signal (where N is an integer number equal to or larger than 2); and
a first frequency divider dividing the frequency of the delayed clock signal by 1/N (where N is an integer number equal to or larger than 2) to generate an output clock signal,
wherein the first frequency divider generates a rising edge or falling edge corresponding to a first one of 2 N edges of N cycles of the delayed clock signal, generates a falling edge or rising edge corresponding to a N+1th one of the 2 N edges, to generate the output clock signal.

12. The delay locked loop (DLL) of claim 1, wherein the first frequency divider generates the output clock signal 180°/N phase-shifted from the reference clock signal (N is an integer number equal to or larger than 2).

13. The delay locked loop (DLL) of claim 1, wherein the first frequency divider generates the output clock signal having a 50% duty cycle.

14. A method of generating a clock, comprising:
inputting a reference clock signal to a delay line to delay the signal to generate a delayed clock signal, and circulating a feedback clock signal corresponding to the delayed clock signal through the delay line to synchronize N cycles of the feedback clock signal (where N is an integer number equal to or larger than 2) with a cycle of the reference clock signal; and
dividing a frequency of the delayed clock signal by 1/N (where N is an integer number equal to or larger than 2) to generate an output clock signal,
wherein the synchronizing of the N cycles of the feedback clock signal comprises:
selecting at least one of the reference clock signal and the feedback clock signal as an input clock signal based on the feedback clock signal,
wherein the selecting of the at least one of the reference clock signal and the feedback clock signal as the input clock signal comprises:
selecting the reference clock signal as the input clock signal and inputting the selected signal to the delay line, after the feedback clock signal circulates N times; and
in response to a rising edge of the reference clock signal, selecting the feedback clock signal as the input clock signal and inputting the selected signal to the delay line.

15. The method of claim 14, wherein the synchronizing of the N cycles of the feedback clock signal further comprises:
delaying the input clock signal at the delay line to generate the delayed clock signal; and
comparing a cycle of the reference clock signal with N cycles of the feedback clock signal to adjust a delay time of the delay line according to a comparison result.

16. The method of claim 15, wherein the synchronizing of the N cycles of the feedback clock signal further comprises delaying the delayed clock signal by a delay time of the output clock signal relative to the delayed clock signal to generate the feedback clock signal, after generating the delayed clock signal.

17. A method of generating a clock comprising:
inputting a reference clock signal to a delay line to delay the signal to generate a delayed clock signal, and circulating a feedback clock signal corresponding to the delayed clock signal through the delay line to synchronize N cycles of the feedback clock signal (where N is an integer number equal to or larger than 2) with a cycle of the reference clock signal; and
dividing a frequency of the delayed clock signal by 1/N (where N is an integer number equal to or larger than 2) to generate an output clock signal,
wherein the synchronizing of the N cycles of the feedback clock signal comprises:
selecting at least one of the reference clock signal and the feedback clock signal as an input clock signal based on the feedback clock signal;
delaying the input clock signal at the delay line to generate a delayed clock signal; and
comparing a cycle of the reference clock signal with N cycles of the feedback clock signal to adjust a delay time of the delay line according to a comparison result,
wherein the selecting of the at least one of the reference clock signal and the feedback clock signal as the input clock signal comprises:
generating a selection signal in response to N circulations of the feedback clock signal (where N is an integer number equal to or larger than 2) and a rising edge of the reference clock signal; and
selecting the at least one of the feedback clock signal and the reference clock signal as the input clock signal according to the selection signal and inputting the selected signal to the delay line.

18. A method of generating a clock comprising:
inputting a reference clock signal to a delay line to delay the signal to generate a delayed clock signal, and circulating a feedback clock signal corresponding to the delayed clock signal through the delay line to synchronize N cycles of the feedback clock signal (where N is an integer number equal to or larger than 2) with a cycle of the reference clock signal; and
dividing a frequency of the delayed clock signal by 1/N (where N is an integer number equal to or larger than 2) to generate an output clock signal,
wherein the generating of the output clock signal comprises generating a rising edge or falling edge in response to a first one of 2 N edges of N cycles of the delayed clock signal, generating a falling edge or rising edge in response to a N+1th one of the 2 N edges, to generate the output clock signal.

19. A method of generating a clock comprising:
inputting a reference clock signal to a delay line to delay the signal to generate a delayed clock signal, and circulating a feedback clock signal corresponding to the delayed clock signal through the delay line to synchronize N cycles of the feedback clock signal (where N is an integer number equal to or larger than 2) with a cycle of the reference clock signal; and
dividing a frequency of the delayed clock signal by 1/N (where N is an integer number equal to or larger than 2) to generate an output clock signal,
wherein the synchronizing of the N cycles of the feedback clock signal comprises:
selecting at least one of the reference clock signal and the feedback clock signal as an input clock signal based on the feedback clock signal,
wherein the selecting of the at least one of the reference clock signal and the feedback clock signal as the input clock signal comprises:
selecting the reference clock signal as the input clock signal and inputting the selected signal to the delay line, after the feedback clock signal circulates N times; and
in response to a rising edge of the reference clock signal, selecting the feedback clock signal as the input clock signal and inputting the selected signal to the delay line,
wherein the generating of the output clock signal comprises generating the output clock signal 180°/N phase-shifted from the reference clock signal (where N is an integer number equal to or larger than 2).

* * * * *